United States Patent [19]
Thomas et al.

[11] Patent Number: 6,005,969
[45] Date of Patent: *Dec. 21, 1999

[54] METHODS AND SYSTEMS FOR MANIPULATION OF IMAGES OF FLOOR COVERINGS OR OTHER FABRICS

[75] Inventors: Glenn C. Thomas, El Cajon; Jay Van Vark, San Diego, both of Calif.

[73] Assignee: Interface, Inc., Atlanta, Ga.

[ * ] Notice: This patent issued on a continued prosecution application filed under 37 CFR 1.53(d), and is subject to the twenty year patent term provisions of 35 U.S.C. 154(a)(2).

[21] Appl. No.: 08/950,479

[22] Filed: Oct. 15, 1997

Related U.S. Application Data

[62] Division of application No. 08/528,438, Sep. 14, 1995.

[51] Int. Cl.$^6$ .................................................. G06K 9/00
[52] U.S. Cl. ............................................................ 382/162
[58] Field of Search .................................. 382/162, 165, 382/167

[56] References Cited

U.S. PATENT DOCUMENTS

| | | |
|---|---|---|
| 4,025,946 | 5/1977 | Casey . |
| 4,318,121 | 3/1982 | Taite et al. . |
| 4,700,181 | 10/1987 | Maine et al. . |
| 4,709,231 | 11/1987 | Sakaibara et al. . |
| 4,788,650 | 11/1988 | Willis et al. ............................ 364/526 |
| 4,901,064 | 2/1990 | Deering . |
| 5,016,183 | 5/1991 | Shyong . |
| 5,053,956 | 10/1991 | Donald et al. . |
| 5,058,174 | 10/1991 | Carroll . |
| 5,255,353 | 10/1993 | Itoh . |
| 5,357,579 | 10/1994 | Buchner et al. . |
| 5,368,485 | 11/1994 | Phillips . |
| 5,473,736 | 12/1995 | Young . |
| 5,535,315 | 7/1996 | Itoh . |
| 5,555,505 | 9/1996 | Oosawa et al. . |

FOREIGN PATENT DOCUMENTS

| | | |
|---|---|---|
| WO 93/12504 | 6/1993 | WIPO . |
| WO 94/20923 | 9/1994 | WIPO . |

OTHER PUBLICATIONS

Supplementary European Search Report of EP Application No. 96933790.6, dated Nov. 11, 1998.

"The New IEEE Standard Dictionary of Electrical and Electronics Terms," *Institute of Electrical and Electronics Engineers, Inc.*, p. 1024 (1993).

*Primary Examiner*—Phuoc Tran
*Attorney, Agent, or Firm*—Kilpatrick Stockton LLP; John S. Pratt

[57] ABSTRACT

Methods and system according to the present invention enable a highly streamlined and efficient fabric or textile sampling and design process particularly valuable in the design and selection of floor coverings, wall coverings and other interior design treatments. A digital library of fabric models is created, preferably including digitized full-color images and having associated a digital representation of positions that are located within and which characterize the models. Via an application implemented according to conventional software methods and running on conventional hardware having high resolution graphics processing capabilities, a user may navigate among the set of alternative models, and may modify the positions of the selected models to test out desired combinations of characteristics—such as poms or yarn ends, for models of floor coverings—and view the results in high resolution. In particular, and also according to the present invention, a method is provided for substituting colors in digital images of photographic quality, while preserving their realism particularly in the vicinity of shadows. The resulting samples or designs can be stored and transmitted over a telecommunications network or by other means to a central facility that can either generate photographic-quality images of the samples, or can directly generate actual samples of the carpet or other material of interest.

3 Claims, 12 Drawing Sheets

METHODS AND SYSTEMS FOR MANIPULATION OF IMAGES OF FLOOR COVERINGS OR OTHER FABRICS

This application is a divisional of U.S. Ser. No. 08/528,438, filed on Sep. 14, 1995.

FIELD OF THE INVENTION

The present invention relates in general to methods and systems for computer-aided design, and, in particular, to methods and systems for the imaging and design of floor coverings or other fabrics.

BACKGROUND OF THE INVENTION

The selection or "sampling" of custom floor coverings and other fabrics has been attended by various inefficiencies that stem from the difficulty of visualizing new color configurations for those fabrics as they would really appear. Typically, sales representatives have been limited to the display and sale of only those models and color schemes they are able to carry along from site to site. Turning around a custom design sample, moreover, has been a time-consuming and expensive proposition. Before an accurate visualization of the sample is possible, it is necessary to select and specify a custom order, to transmit the order to a mill, to produce a corresponding sample at the mill by a labor-intensive process, and to await shipment of the sample. Even assuming a particular customer were able to visit a mill at which custom samples could be produced, the time and expense involved in experimenting with various color schemes and producing fabric and textile models would itself be prohibitive and could impose a limit on the range of options that a customer could explore. The variety of available models of floor coverings and other fabrics has proliferated as a result of improvements in fabrication technology, among other factors, which has increased the number of choices available to designers and other persons choosing custom carpet. This trend has further complicated the customer's decision process.

Rather than persisting with the arduous process described above, it would be vastly preferable for a sales representative to be able to visit a customer without needing to bring along the full panoply of models and colors, and yet still enable the customer to accurately visualize the gamut of possible design choices. Still more helpful would be an ability to permit the customer to independently vary the treatment (e.g., the color) of components of images of a floor covering or other fabric essentially at will, to store one or more representations of these variations, and specifications of samples embodying particularly promising design specifications, to quickly generate a set of alternative designs based on different models and with different color schemes, and to be able to compare and contrast the alternatives as a method of winnowing the set of design options to one of manageable size. Once a set of design alternatives has been chosen, it would greatly assist vendors as well as the customer to be able, in comparatively short order and in a convenient fashion, to perform a side-by-side comparison of the design alternatives. No such capability has been available, however.

Perhaps the most challenging obstacle to assisting in the design and selection of custom fabrics is presented by the sensitivity of the human eye (particularly the well-trained eyes of design professionals) to shortcomings in the predictive representations of custom articles. This sensitivity places a premium on the reality of the representation despite the variation of image parameters such as color. A system for representing and allowing the manipulation of high-resolution images therefore most preferably should provide an ability to manipulate parameters of a photographic image, and to do so with convenience and convincing results. Such a system should be able, for example, to modify the color and structure of components in a photographic image of a floor covering or other fabric, and, particularly, to do so in the vicinity of shadows or other factors that may tend to undermine the realism of the image when a color transformation has been requested. To date, however, capabilities of this sort have not been available.

SUMMARY OF THE INVENTION

The present invention solves the foregoing problems by providing methods and systems for representing floor coverings or other fabrics or textiles of various models, and permitting a user to vary characteristics of subsets or portions of images of the models to visualize models that incorporate the selected variation(s). The present invention also provides a technique for converting selected fabric design parameters into a format that can be used to generate representations of even higher resolution within a short turn around time. Still further, the present invention provides a method and system whereby the images that are manipulated are of photographic quality, and the manipulation of colors can be performed while preserving the realism of the image even in the presence of shadows or other influences that may tend to lead to unrealistic-looking results.

One embodiment of a method according to the present invention, for example, comprises a method for computer-aided manipulation of characteristics of an image of a fabric, such as a floor covering. The method is implemented on a computer coupled to a display means and a user input means. The imaged fabric has at least one "position" comprising a subset of the fabric that is to be given substantially the same treatment (such as the same color yarn end or pom). At least one image of a fabric, and preferably a library of such images, has been stored in a memory in a computer readable and manipulable format. Also stored in a computer readable and manipulable format, and in association with each of the fabric images, are data defining the one or more positions of the fabric. Furthermore, at least one treatment defined by at least one characteristic (e.g., yarn end or pom color) has been stored in a memory in a computer readable and manipulable format. A selected image of a fabric (chosen from the at least one stored image) is displayed. A position selected from among the at least one positions of the fabric is then identified, and a selected treatment from among the at least one available treatments is also identified. The selected position of the selected image is then modified to display the selected treatment for that position, and the image, including the modified position, is then displayed. A system or apparatus for implementing the foregoing method is also disclosed.

An embodiment of another aspect of the present invention involves selecting at least one color in a color photographic image of a floor covering or other fabric, for example, and replacing that source color with a target color. Prior to implementation of the method, the RGB and YIQ color model values (described in the Detailed Description Section of this document) for the source and target colors have been stored in a data storage device. In addition, the color photographic image, including the subset of the image having the source color, has been digitized to produce a full color digital image represented according to the RGB color model and the digital image is stored in a data storage device (preferably among a library of such images). The RGB values for the source color and the target color are transformed from the RGB color model to the YIQ color model. An adjusted Y value is computed based on the Y values for the source and target colors. Then a replacement YIQ representation is created using the adjusted Y value and the I and Q values of the target color. The resulting modified YIQ representation of the target color (including the I and Q values of the target and the adjusted Y value) is then transformed back into the RGB color model. The resulting values yield a display in which the source color has been replaced by the target color, and in which the luminance of the result has been adjusted to maintain a realistic look.

Accordingly, it is an object of the present invention to provide methods and systems for permitting a person, with the aid of a computer, to visualize a wide variety of fabric or textile designs, as well as changes in desired characteristics of such fabrics or textiles.

It is another object of the present invention to provide methods and systems for providing realistic representations of fabrics and textiles, such as carpets, such that component characteristics of the represented fabric or textile can be modified or manipulated by a designer or other user with the aid of a computer.

It is yet another object of the present invention to provide methods and systems for allowing a user of a computer to modify visual characteristics of fabrics or textiles, such as the color of portions of a carpet by manipulating aspects of photographic images of such fabrics and textiles.

It is a further object of the present invention to generate a set of alternative design selections for a fabric or textile carpet, that can be conveniently compared, and to provide a mechanism whereby a higher resolution representation can be provided in a short turn-around time to facilitate such comparison.

It is still a further object of the present invention to provide a method and system for adjusting colors in photographic quality images of fabrics, textiles or other materials, while preserving the color realism of such images in the vicinity of shadows or other features that may tend to give the transformed color an unrealistic look.

DETAILED DESCRIPTION OF THE INVENTION

The methods and system according to the present invention facilitate the selection of design parameters by persons involved in choosing custom fabrics and textiles, such as floor coverings, wall coverings, window treatments, or other fabrics. Specifically, the disclosed methods and systems permit a user to visualize modifications to the characteristics of components or portions of a fabric or textile by selecting and manipulating high quality digital images of these materials to produce highly realistic photographic-quality renderings of the various generated options. These images can be stored and recalled for subsequent comparison, and may be used as the convenient and economical basis for generating still higher quality representations or samples of the candidate designs. The methods and system are generally applicable at least to cloths, textiles, fabrics or other materials, whether tufted, woven, knitted, or otherwise manufactured. In one embodiment, described herein, the methods and system according to the present invention facilitate the selection or design of custom carpet. Although described with reference to floor coverings such as carpeting, for which the described methods and systems are particularly effective, the principles of the present invention are not limited to use in connection with floor covering markets, but are applicable to fabrics more generally.

The designs of a carpet, wall-covering, or other fabric can be characterized by several parameters, but a particularly useful one for purposes of the present invention is captured by the notion "position." A position in a fabric can be thought of as a subset of the fabric, all of which is to be given a particular "treatment." Although treatment here is intended to mean any characteristic, color is particularly important and its manipulation is emphasized in the present invention. Thus, a given position in a fabric can be defined by all portions of that fabric having a particular color, whether or not those portions are contiguous. A fabric may have several positions, each characterized by its own pom or yarn end having a particular color and/or construction. A "pom" is often used to refer to a small bundle of yarn used for demonstration purposes to show the structure and color of a given yarn type. A "yarn end" refers to the visible portion of the material occupying a particular position.

Figure 1:
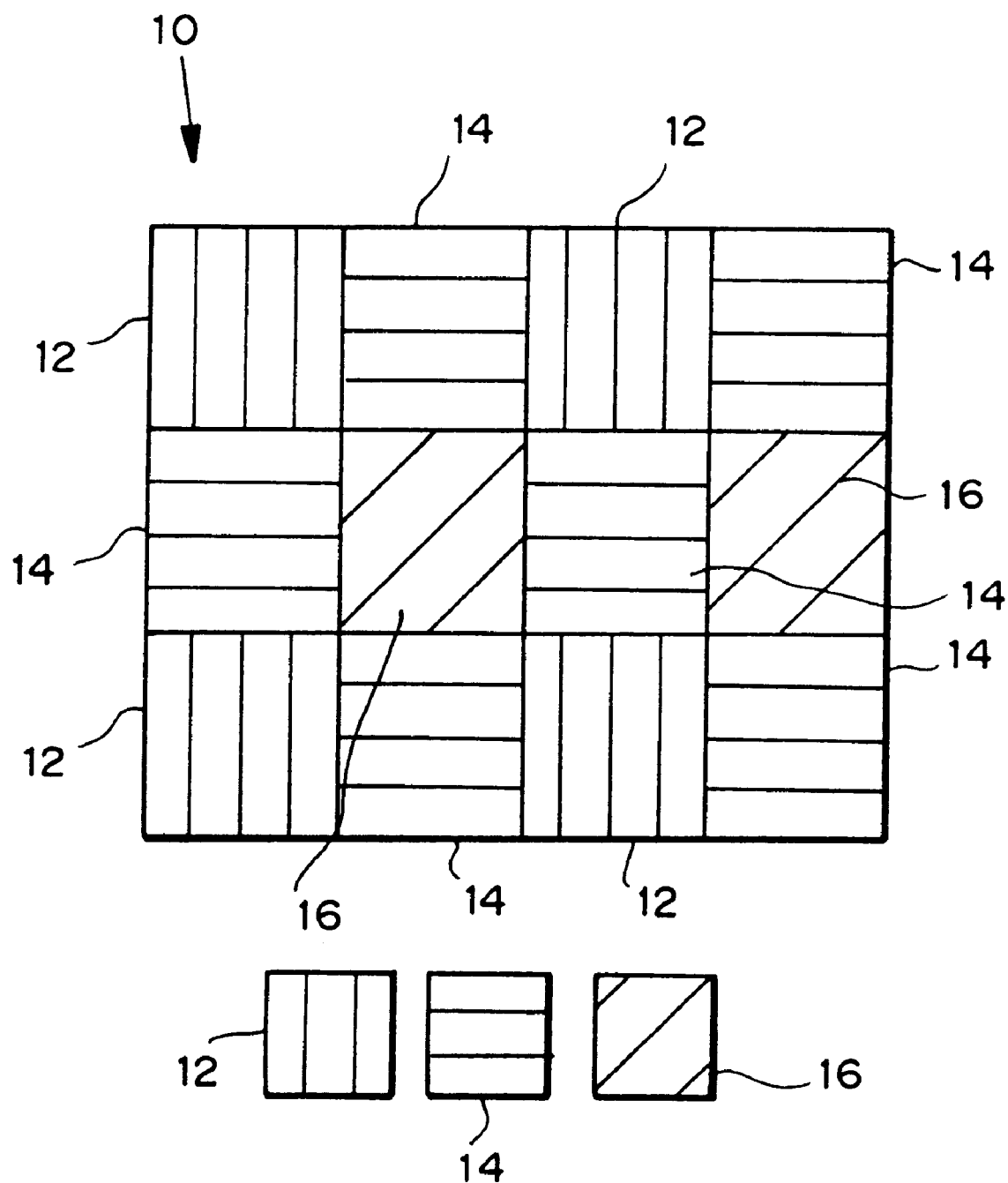
FIG. 1 is a schematic illustration of a portion of a simplified, hypothetical fabric or textile having three positions.

Accordingly, a model, pattern or style of a fabric, such as a floor covering, may be characterized at least by the number and arrangement of the positions it includes (regardless of the color or construction of the actual poms or yarn ends that may fill those positions). In FIG. 1, for example, a highly simplified rendering of a sample of a floor covering model 10 is shown in schematic form. This hypothetical floor covering model 10 includes three positions. The treatment (e.g., the pom or yarn end) in each of the positions is shown in the legend below the figure. A first treatment 12 is symbolically depicted by vertical lines, second treatment 14 is symbolically depicted by horizontal lines, and a third treatment 16 is symbolically depicted by diagonal lines.

The fabric sampling and design methods and processes according to the present invention begin with preliminary steps for generating a database of floor covering models which serve as the starting point for the sampling and design process. Since carpet design is constrained by the machine processes used in the mills to manufacture the actual carpet, the design and sampling methods and systems according to the present invention use existing models as a starting point. This approach is economical, because it constrains the possible design outcomes to structures that can be fabricated. If a designer were able to specify any design without constraint, it could well turn out that the result could not be fabricated according to known methods. With the approach taken by the present invention, this possibility is precluded. Moreover, the fact that the models originate with an existing repertoire of an existing mill implies that the production of actual samples, or full orders of carpet, can be produced economically and in short order.

In addition, rather than confronting the user with a tabula rasa—a blank slate—the existence of a rich set of models provides some structure to the design and sampling process. The models provide a multiplicity of starting points, which may be of assistance to a customer in initiating the mental portion of the sampling and design process. That the number of existing alternative models is large keeps the design and sampling process from being unduly or unreasonably constrained. Between the large number of models, as well as the large number of yarn ends or poms, the size of the design space—that is, the number of possible combinations—can be very large. The methods and systems according to the present invention, however, permit a customer to negotiate that design space in such a manner as to quickly arrive at a set of desired alternatives, and with such realism that the customer can predict with a high degree of accuracy how the actual floor covering (or other type of fabric) will appear.

Figure 2:
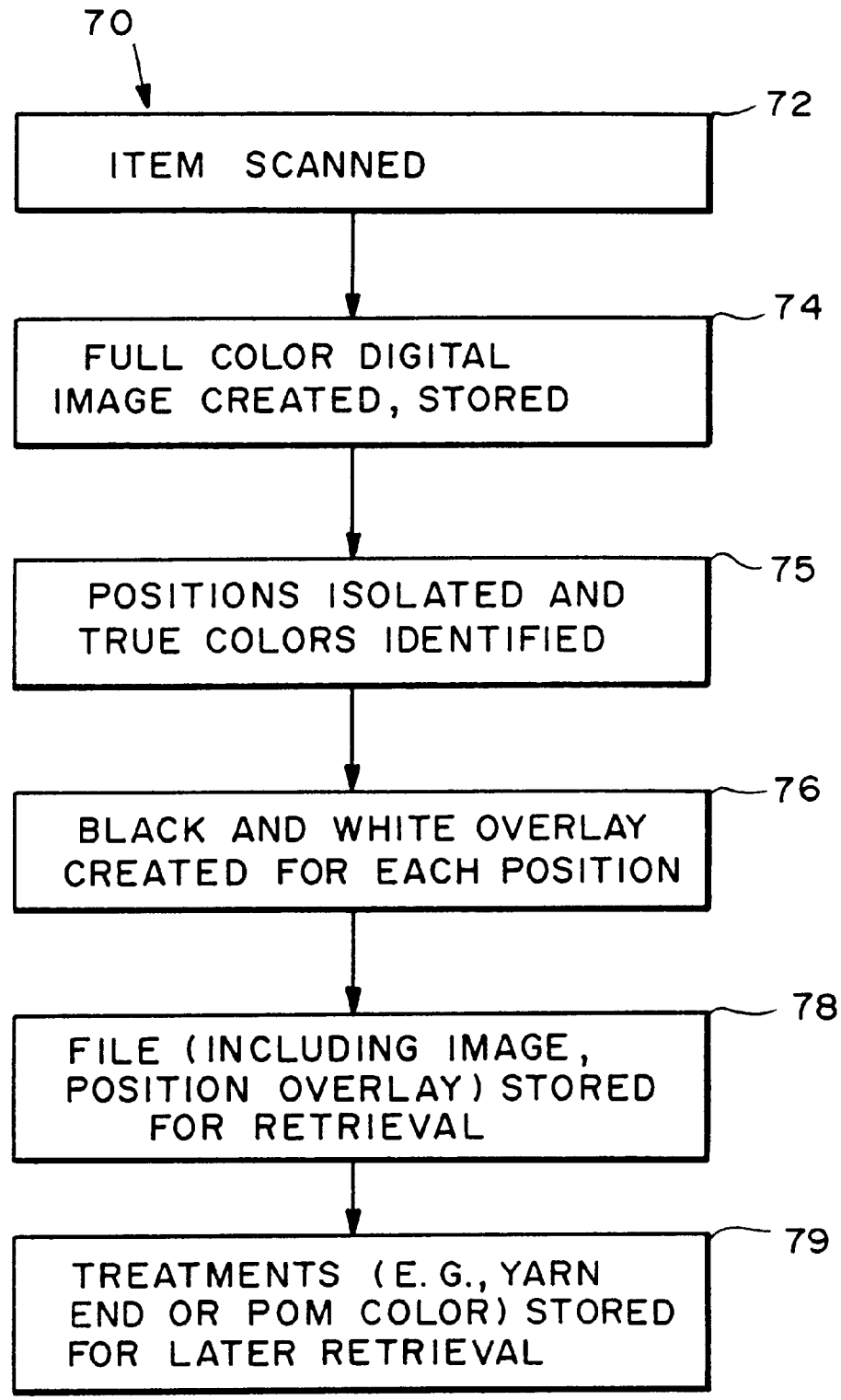
FIG. 2 is a flowchart showing preliminary process steps associated with a method according to and embodying the present invention.

As a precursor to creating or running the methods and system according to the present invention, a number of pre-application steps 70, shown in FIG. 2, are performed in order to create a database of models that form the starting points and, in a sense, the templates, for the design process. First, an actual item, such as a sample of carpet representative of a particular model, is digitally scanned at 72 according to known methods to create a full color digital image at 74. Each carpet sample is most preferably one in which the colors of the poms or yarn ends in the particular positions are preselected to be of high contrast with respect to one another, regardless of any aesthetic shortcomings of the combination. Choosing the colors in this manner tends to maximize the resolution of the boundaries between positions. The digitized image is then retrievably stored in a database according to known methods, and in association with a code identifying the model. The code is preferably one that is understood by the mill or mills that will be called upon to fulfill an order for a variation upon the model, or should at least be convertible to a form recognizable by the mill.

Once the image has been retrievably stored in a memory, the positions of the model are isolated at step 75. The isolation and storing of the positions based on a full color digital image, as well as the remaining pre-application steps 70, can be done with conventional graphic design systems, such as (but not limited to) PHOTOSHOP®, by ADOBE SYSTEMS, INC.® This process creates a data structure that defines the positions with respect to the original image, by creating a bitmap, for example. Also at step 75, a true or representative color for that position is identified or established, which is necessary for comparatively characterizing shaded portions of the image when the color is modified. Once the positions have been isolated, a black and white (or luminance) image or overlay is created at step 76 for each of the positions. One (or more) file including the image, the black and white position overlays, and the model identifying information, is (are) then created and stored at step 78 for retrieval in association with the application. The pre-application steps 70 may be repeated as many times as necessary to create a library of the models that a particular mill or mills are capable of manufacturing.

In a manner similar to the creation of a library of models, a library of available poms or yarn ends having a particular construction, is also created at step 79 by scanning actual samples of carpet to generate a digitized image showing the structure of carpet having the particular pom or yarn end. Additionally at step 79, for each scanned image, a set of permissible colors are coded in association with an identifying name, as well as an indication of the "true" color specified in terms of the computer graphics code for that color (e.g., the RGB code, further described below in connection with FIG. 10). The selection of the code for the "true" color, as with the scanning of the carpet models generally, can be done by a person using PHOTOSHOP® or other suitable system. As with the model position colors, a single true color value needs to be designated, since the presence of shadows and the like in a particular image creates a variety of perceived colors for a carpet of a particular hue.

Figure 3:
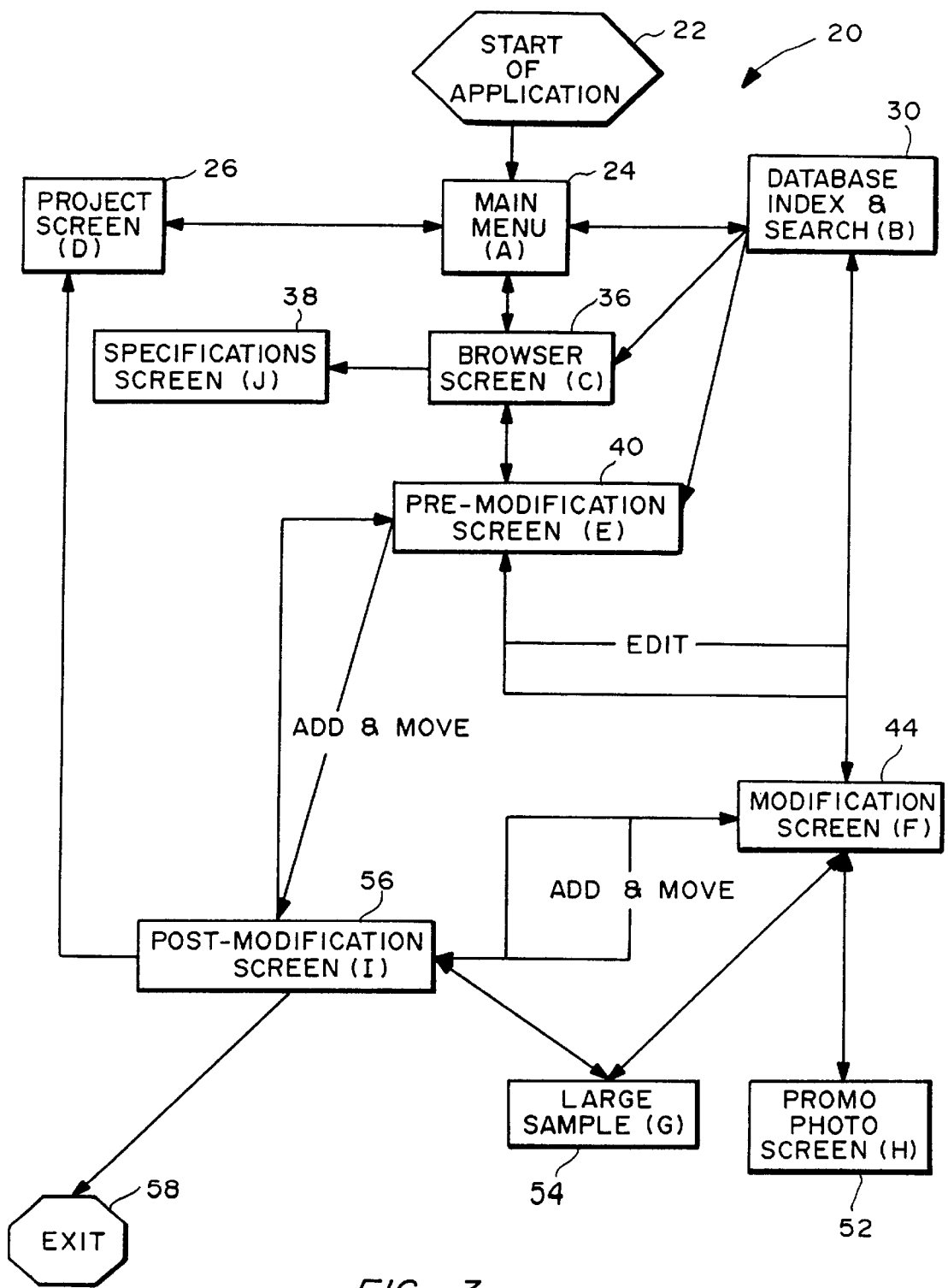
FIG. 3 is a high-level block diagram of an embodiment of methods according to and embodying the present invention.
Figure 4:
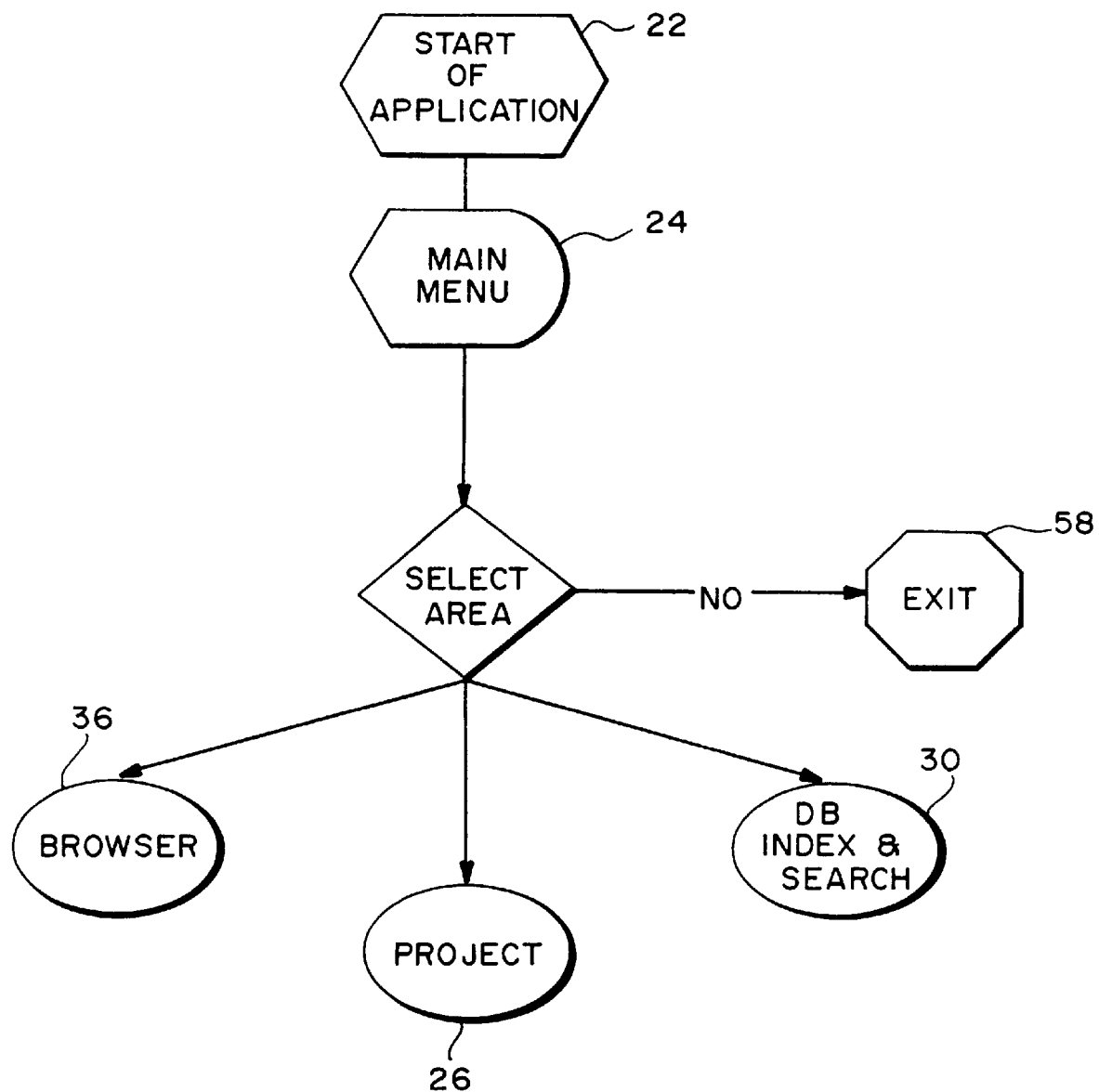
FIG. 4 is a first portion of a flowchart showing the start, main menu and browser portions of the embodiment of the present invention shown in the diagram of FIG. 3.

A block diagram illustrating the architecture of a software application 20 embodying the methods and architecture of the system according to the present invention is shown in FIG. 3. In the following description, the term "screen" may be used to denote a user interface, which can be of any sort, but which is preferably a graphical user interface (GUI). The application steps described below can be implemented using existing computer languages, such as the C++ programming language. The method and system according to the present invention is shown in procedural (flowchart) form. This, however, is not intended to indicate that the methods and system according to the invention are, or need to be, implemented using a procedural programming model, rather than an object-oriented model. Either of these, or any suitable alternative models, can be used. In the procedurally-oriented flowcharts shown in the Figures, the apparent ordering of various of the steps to enter or depart from different states associated with particular user interfaces does not reflect an ordering that a user needs to follow; rather, it shows, for clarity of illustration, a representative "path" through the system that a user may take. The user, however, may in general freely move between such states within the constraints shown in FIG. 3. In addition, the invention is not limited to the states depicted, but involves the underlying functionality accessible to a user by entering those states. Those functions could be rearranged to a certain extent to involve a greater or lesser number of such user interfaces and states without departing from the spirit and scope of the present invention.

Figure 5:
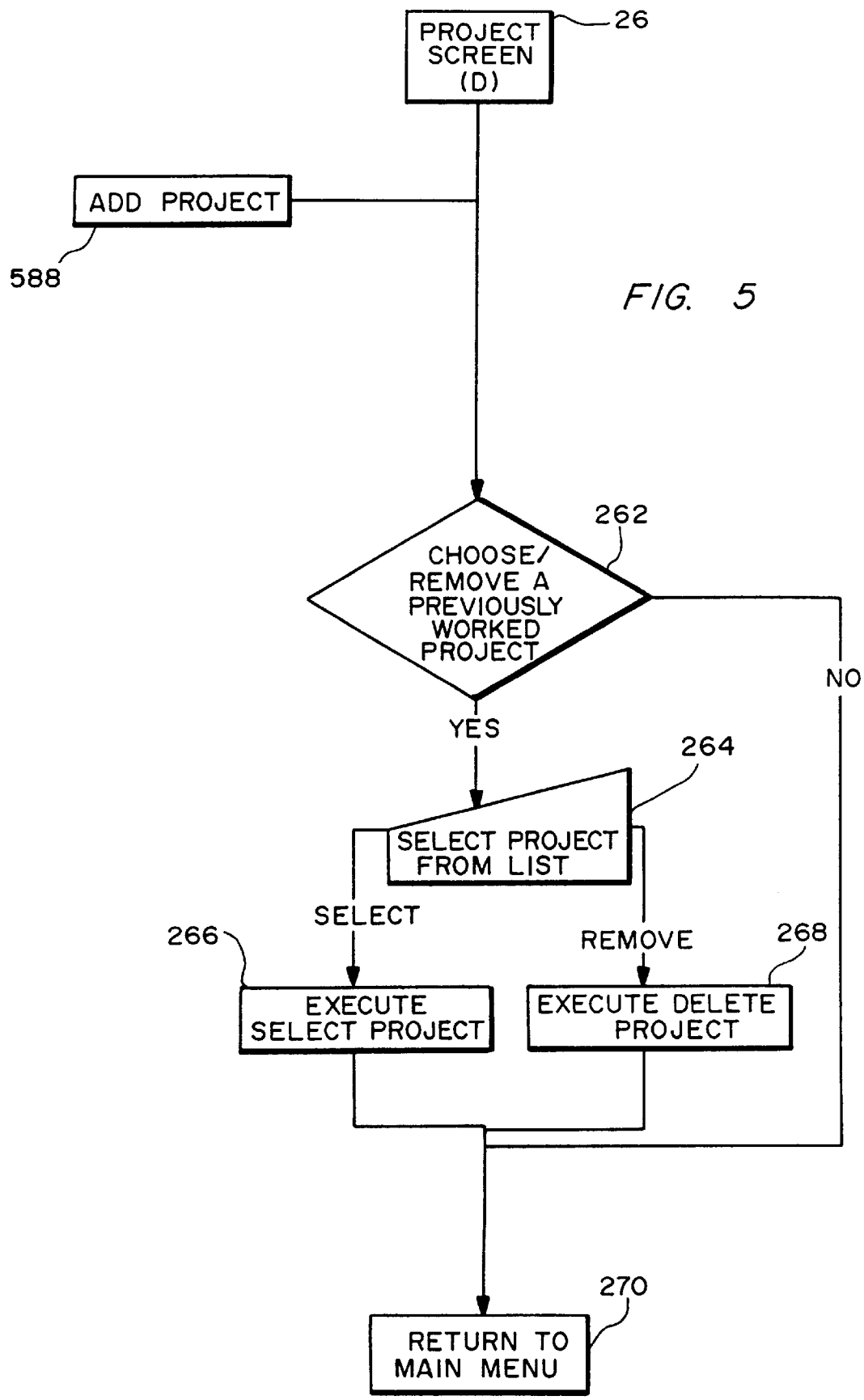
FIG. 5 is a second portion of a flowchart showing the project portion of the embodiment of the present invention shown in the diagram of FIG. 3.
Figure 6:
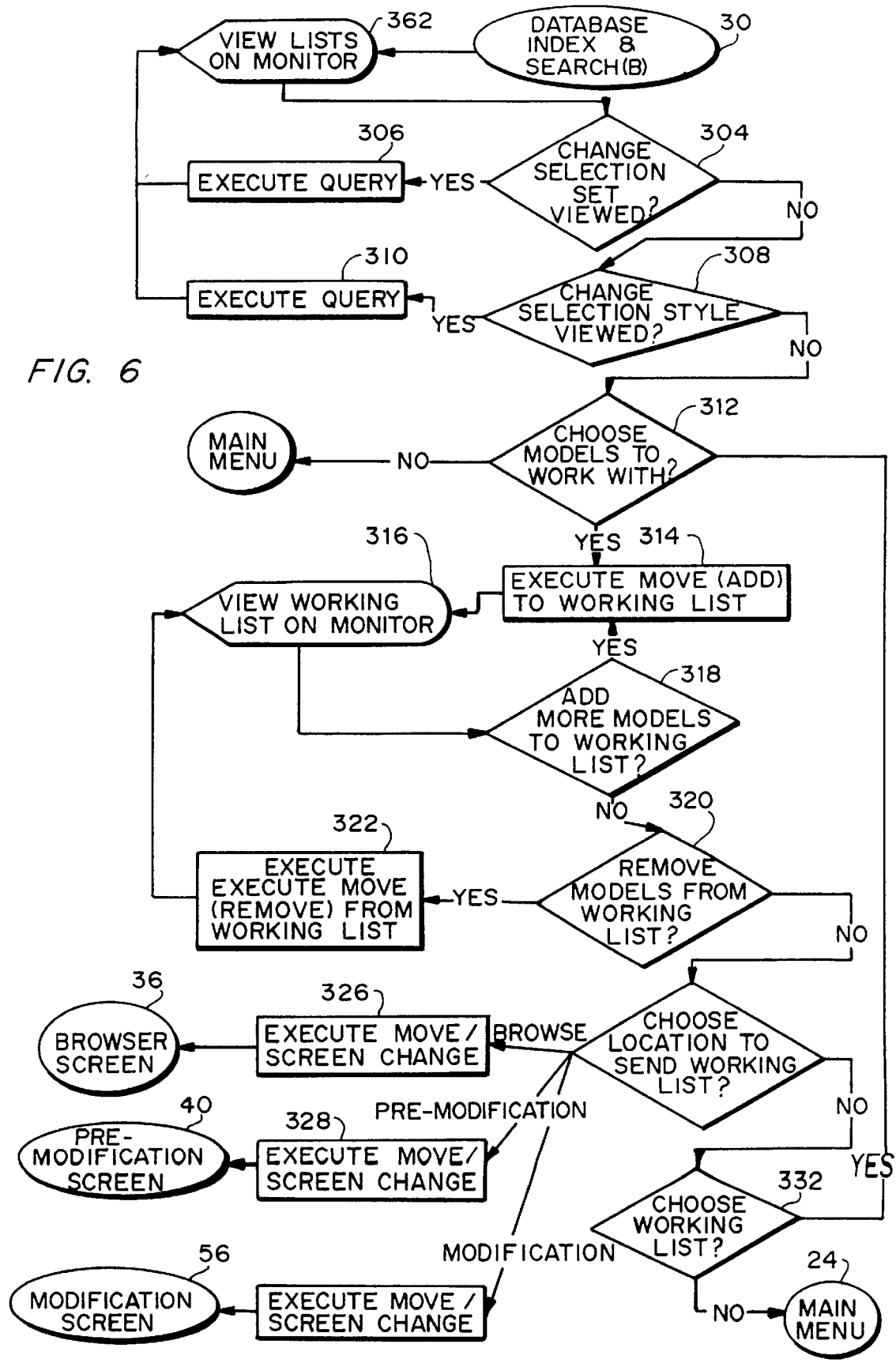
FIG. 6 is a third portion of a flowchart showing the database index and search portion of the embodiment of the present invention shown in the block diagram of FIG. 3.

Following the start 22 of the application 20, the user is presented with a menu 24. From the main menu 24, the user may transition between a project screen 26, a database index and search screen 30, and a browser screen 36. The project screen, as further described below with reference to FIG. 5, provides an interface for the user to identify and select among existing projects created during earlier sessions with the application. The database index and search screen 30, on the other hand, affords the user access to a data base for one or more mills or vendors of floor coverings (or other fabrics of interest), described at greater length below in connection with FIG. 6. Via the browser screen 36, the user may, for a given project, view the models on the project working list in a slide-show format. described in greater detail below with reference to FIG. 7. One can also access a specifications screen 38 for quickly obtaining a listing of information regarding a particular model. From each of the project screen 26, the database index and search screen 30 and the browser screen 36, the user can return to the main menu 24. A user can also move directly from the database index and search screen 30 to the browser 36, or to a pre-modification screen 40, which can also be invoked from the browser screen. From the pre-modification screen 40, a user may sort and view images of sample designs, as might be done if samples were being examined, considered, or perhaps eliminated from consideration, on a table top. The pre-modification screen 40 is described in connection with FIG. 8, below.

A user can also invoke the modification screen 44 from either the database index and search screen 30 or the pre-modification screen 40. It is via the modification screen 44 that a user may design and/or manipulate images of model fabrics, such as floor covering models, and select and modify the treatment of positions of selected models. The functionality accessible to the user via this interface is described below with reference to FIGS. 9 and 10. A user interacting with the modification screen of a system according to the described embodiment of the invention can move, for editing purposes, back to the pre-modification screen 40, or can return to the database index and search screen 30. In addition, the user can move to and from a post-modification screen 56 if she or he has, for example, arrived at a set of floor covering selections. Alternatively, the user can move to a promo-photo screen 52, in which a user can view a photographic image of an actual carpet model in a real environment, or to a large sample screen 54, which allows the user to zoom out and view a larger area of the sample including many more pattern repetitions than are ordinarily visible. From the large sample screen 54, the user may proceed to the post-modification screen 56.

In the post-modification screen 56, the user can decide which items on the working list are to be ordered in photographic form, and can then place those orders. The user can also organize the working list into one or more projects that can be re-invoked for further work or otherwise referred to at a later time. A user may return to the pre-modification screen 40, in which the user can sort through the various items on the working list using a table top paradigm—as a customer and a sales representative might use a table top to display, compare, inspect and discuss various design options in a preliminary fashion. Then, the user may return from the pre-modification screen 40 to the post-modification screen 56, and can bring a selected model or sample from the pre-modification screen 40 to the post-modification screen 56, where it can be added to a working list for a given project.

From the post-modification screen 56 one can also move to the project screen 26, at which the user can browse through a list of existing options and select one to work with. Finally, as depicted in FIG. 3, one may invoke an exit function 58 from the post-modification screen 56. Although this is the most logical point of departure from the application, and the clearest manner of illustrating the architecture of the application, the user can, of course, exit from other points in the application if necessary or desired via main menu 24.

As seen in FIGS. 4–9, from the main menu 24, a user can select from among three areas or interfaces: project screen 26, database index and search 30 and browser 36, or can exit at 58. When interacting with the project screen 26, shown in FIG. 5, the user can enter the application by choosing at step 262 to resume work on a previously begun project. The user can also, beginning at step 262 (which can be entered from the post-modification screen, discussed below), remove or delete a project (i.e., a text file including client information and specifications for samples generated in a given session) with which she or he has previously worked. If a previously worked on project is to be retrieved or deleted, the user is presented with a project list at step 264. The user may then either execute a selection of a particular project at step 266, which retrieves from storage the files for previously designed samples, or, alternatively, execute a deletion at step 268 of the files associated with an existing project. At step 270, the application may then return to the main menu, from which another interface can be selected.

If a user had not previously generated a set of sample designs, or had decided to delete them at step 268, she or he can develop a working list of candidate models with which to begin the process. From the main menu 24, the user selects the database index and search screen 30, via which the user can begin by viewing a list of models on the monitor, at 302. The database index and search screen 30 preferably includes means for listing available styles of carpet organized by such indicia as style category, machine type and dye method. For each of these categories, the default display may be the first N instances (e.g., as organized alphabetically), or they can be any desired default set. If any of the displayed choices are of interest to the user, those choices can be selected, and the selections preferably indicated to the user, such as by being placed in a list. If the user wishes to change the selection set of the displayed list of models, that selection can be made at step 304, and an associated query is executed at step 306. Selection set, as used here, refers to the most basic categories that might be assigned to carpeting by a mill. For example, a first selection set might include the mill's running line, while a second selection set could include the mill's custom styles. The user may view the list corresponding to the selected set on the computer display means, at step 302. Again, and as many times as desired, the user can modify the selected set at step 304 by either adding additional models of interest or deleting them. During this process, the user has the option at step 308 of changing the selection style being viewed and thereby increasing the range of styles that can be worked with. The selection style is intended to refer to a class of models having a particular style category (e.g., pattern type), machine type (e.g., PCL, loop/loop, etc.), dye method (e.g., piece dye, yarn dye, etc.), or other characteristic. If the user wishes to do so, then at step 310 a query is executed and the resultant list can be viewed on the computer display at step 302. The user can then decide at step 312 whether the viewed list includes one or more models of interest. In this case, the application moves to 314, at which one or more displayed models can be used to begin (or to add to, on subsequent iterations) a working list. The entries on the working list can be viewed on the monitor, as at step 316. If the user wishes, at step 318, to add one or more models to the working list, the process can return to step 314; otherwise, the user may choose at step 320 to remove models from the working list. In this event, the user can execute a move (i.e., a remove) from the working list at step 322, viewing the working list on the monitor, at 316.

If the user does not desire to remove one or more models from the working list, she or he may consider moving to a different screen with the working list. For instance, the user, having arrived at a working list, may decide to browse the working list by iterating through displays in the form of a slide show by moving at 326 to the browser screen 36. Or, the user may wish to manipulate or re-organize the members of the working list prior to modification of those members by moving, at step 328, to the pre-modification screen 40. If the user considers the working list to be in a suitable condition for beginning the design process, she or he can execute a change at step 330 to the modification screen 44. For each of these moves to different screens, the working list remains intact for access from the new screen.

Figure 7:
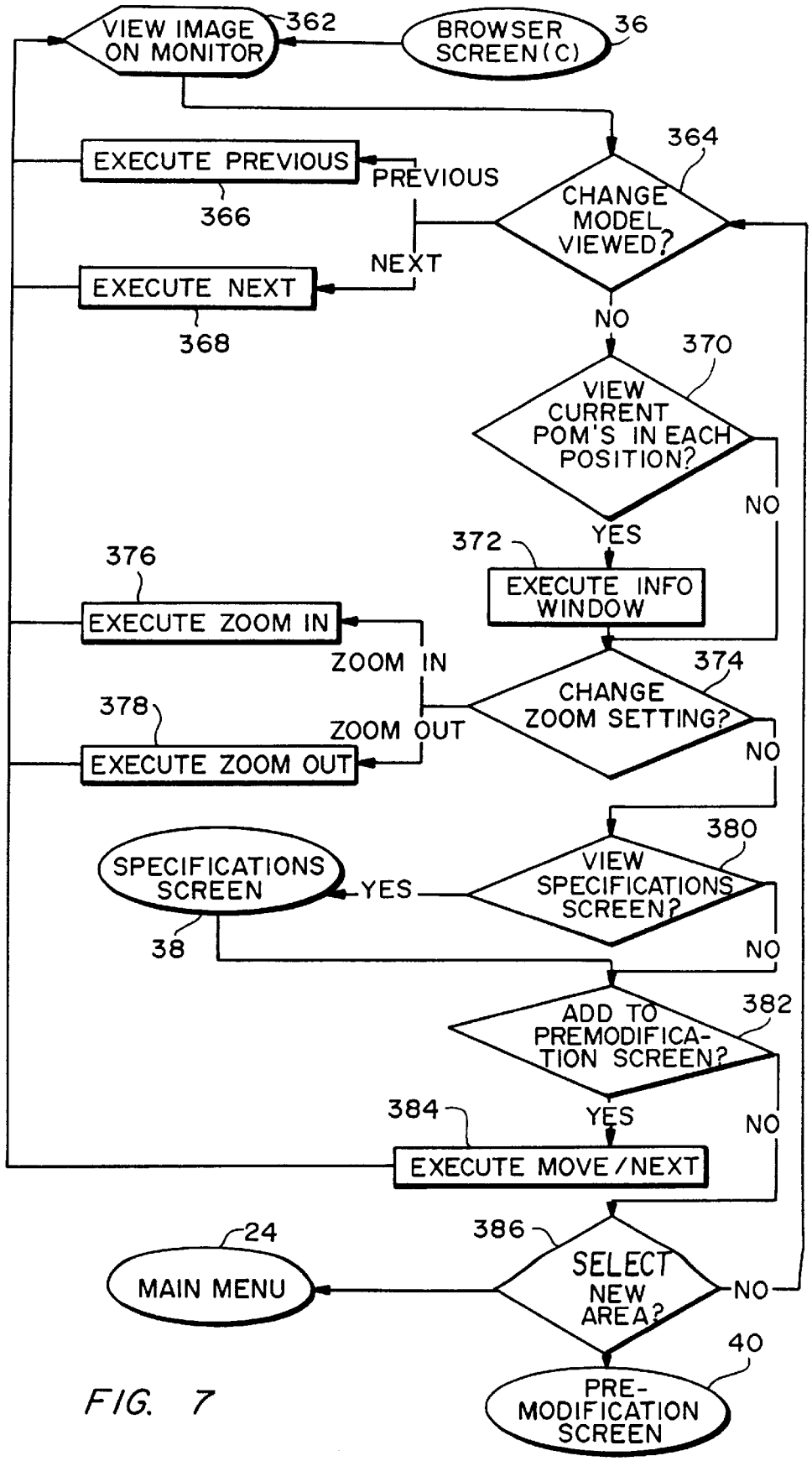
FIG. 7 is a fourth portion of a flowchart showing the pre-modification portion of the embodiment of the present invention shown in the block diagram of FIG. 3.

The browser screen 36 can be entered from the main menu 24, the database index and search screen 30 or the pre-modification screen 40. The paradigm for the browser screen 36 is that of a slide show, through which the user can browse at the items on the working list. As shown in FIG. 7, each image can be sequentially viewed, at 362, on the monitor, with the ability at 364 to move back to a previously viewed image at 366, or to move forward to another image at step 368. When, during this process, an image of a sample design of particular interest has been arrived at, the user may choose at 370 to view the current poms or yarn ends, which are then retrieved from memory and displayed as an overlay on the screen image of the model being viewed. Each position may be shaded in a particular manner, and a legend may be displayed correlating that shading to the corresponding position. The user may also choose at step 374 to zoom into (376), or out of (378), the image, to get a more fine-grained, or a more global, view of the image. If the user wishes, she or he may choose at 380 to move to a specification screen 38 to view the specifications associated with the model depicted in that image and the yarn ends or poms in the positions of that model. For example, but without limitation, the user can see the item code for the style corresponding to a selected model and a description of the style (or an identifier, such as a product name). In addition, the specification screen may reveal information about the machine gauge and/or type corresponding to the style, as well as the weight of the fabric (e.g., the tufted weight of a carpet). The user may also learn about the dimensions within which the pattern of the style repeats, and a minimum yardage required for orders of the carpet.

The user may also decide, at 382, to add the sample design being viewed, at step 384, to a list of sample designs to be viewed from the pre-modification screen 40 (the image of the sample design being viewable at 362). The user is otherwise free to move at 386 either to the pre-modification screen, or back to the main menu 24.

Figure 8:
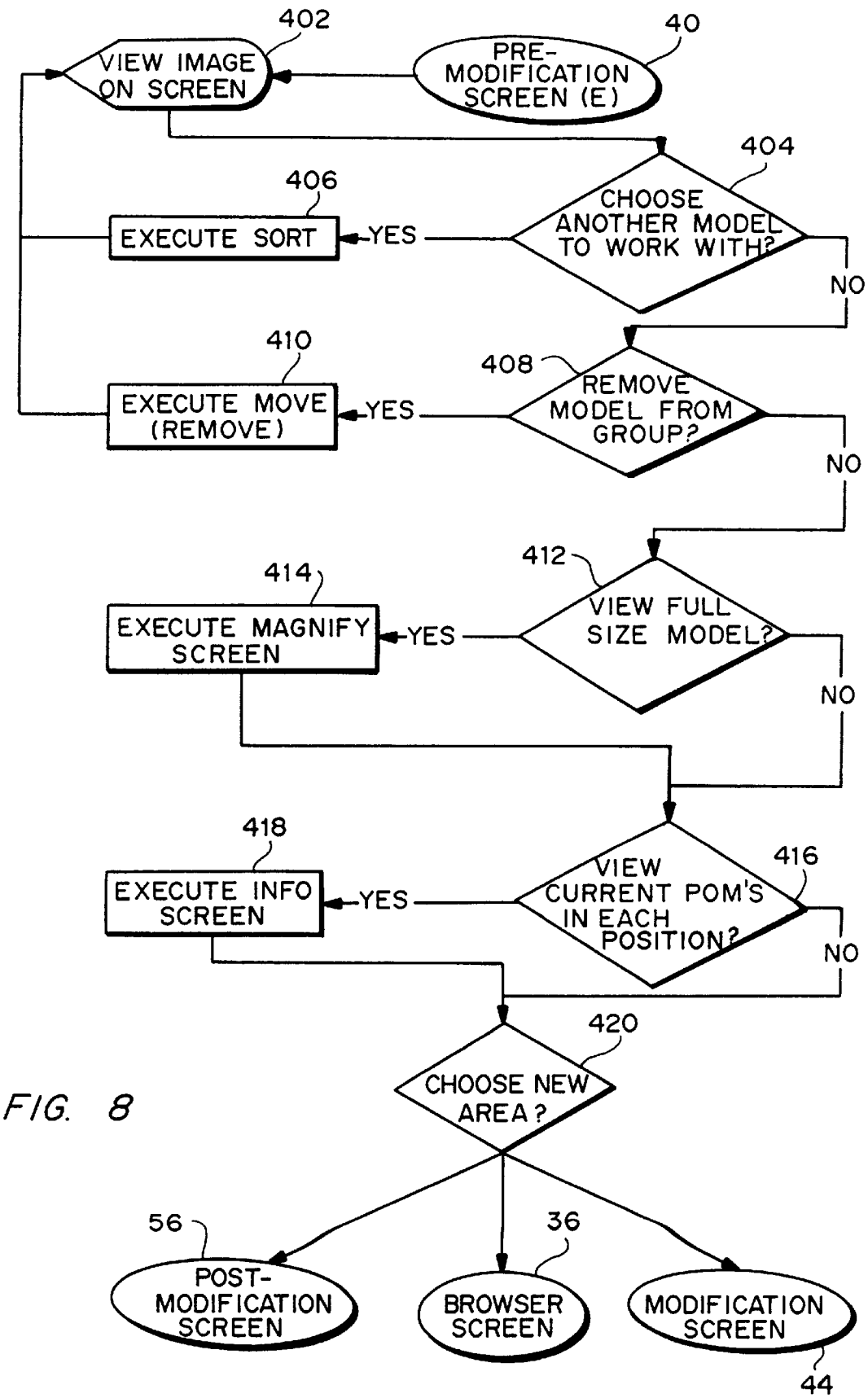
FIG. 8 is a fifth portion of a flowchart showing the modification portion of the embodiment of the present invention shown in the block diagram of FIG. 3.

The pre-modification screen 40 can be thought of as a kind of a stack or table top on which a sales representative might spread out a set of samples for the customer to consider. The table top is simulated by the screen on which the images can be brought up for viewing, at 402. As shown in FIG. 8, a user may choose at 404 to "flip" through the various models in the working list to arrive at another sample (406) for viewing (402). The user can also choose at 408 to further winnow down the set of candidates by removing them at 410 from the working list, with an opportunity to view the sample to be removed from the list at 402. The user may also choose at 412 to alter the view of a sample, such as to view the sample in a full size mode, in which a larger swath of the sample can be visualized, at 414. The user can also call choose at 416 to call up the identity of the poms or yarn ends for the positions of the current sample at 418. From the pre-modification screen 40, the user can move ahead to the modification screen 44 if she or he wishes to modify the treatment of the positions of any of the samples. The user can, alternatively, return to the browser screen 36 to review and reconsider the candidates in the working list, or can move to the post-modification screen 56, at which the working list of candidate samples can be compiled into one or more projects for storage and later recall.

Figure 9:
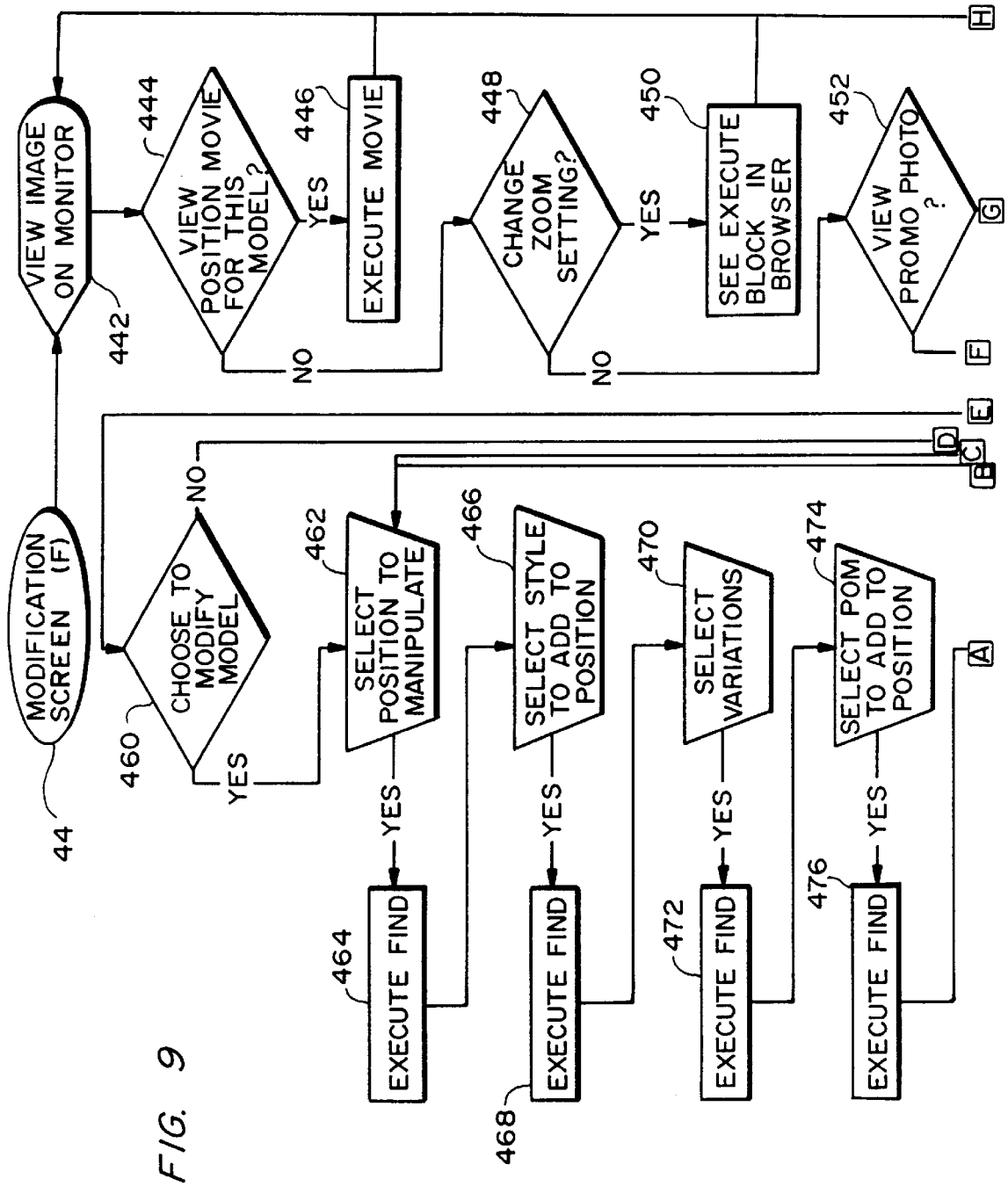
FIGS. 9, 9A is a sixth portion of a flowchart showing the modification portion of the embodiment of the present invention shown in the block diagram of FIG. 3.
Figure 9A:
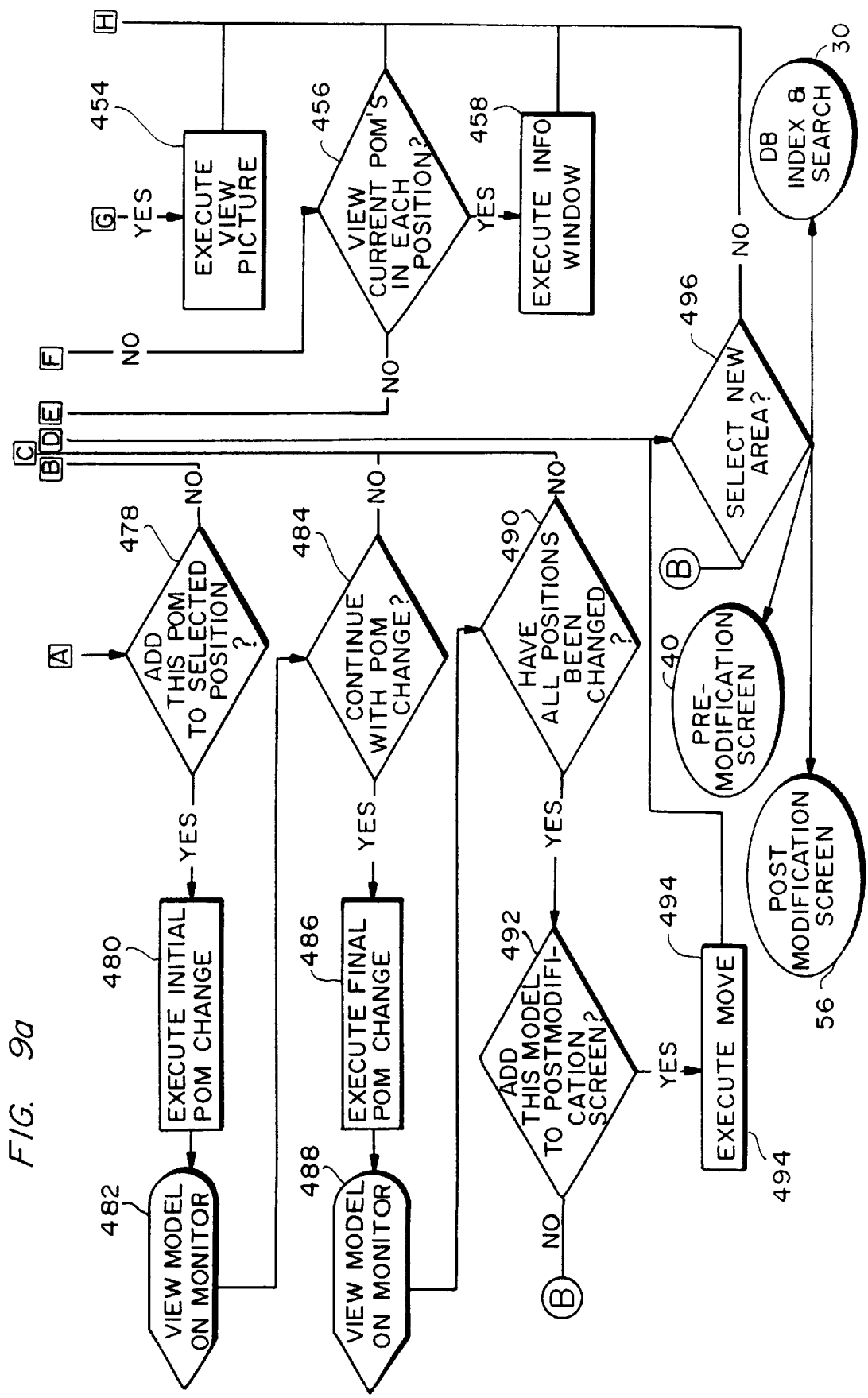

A user wishing to vary the treatment of the positions of a selected sample would move to the modification screen 44, flowchart steps for which are shown in FIG. 9. The interface provided by screen modification screen 44 permits the user to view the selected sample image at 442 and to vary the views of the image. For instance, the user at 444 can choose to view a brief animated image in which each of the positions are individually highlighted, at 446. In one embodiment, as the positions are indicated, they are filled in (using conventional "clipping" methods available through software running on the APPLE MACINTOSH®, for example, or other suitable systems) with a particular color or pattern, and a corresponding window opens for indicating the number of the position and containing the same color or pattern, so that multiple positions can be highlighted simultaneously. The user may also choose at 448 to zoom into or out of the displayed image at 450 (using functionality similar to that used at steps 376 and 378 of the browser interface 36). If the user is interested in comparing a sample of a particular model of interest with a promotional (promo) photo of that model showing it installed in an actual setting, that option can be selected at 452 and executed at 454. Alternatively, the user can select (as he or she could in the browser interface 36 and in the pre-modification interface 40) at step 456 to view at step 458 the yarn ends or poms of the currently viewed sample.

The user also has a number of options for varying the treatment of the positions of a selected model. The flowchart of FIG. 9 indicates that the user, at 456, could decline to view the poms or yarn ends in the positions of the sample currently being viewed; however, the choice to modify the treatment of the positions of the sample could just as easily have been shown as being initiated from any of the viewing options 444, 448, or 452, and these options are contemplated by and fall within the scope of the present invention. When the choice not to vary the views of the current sample has been made at 456 (or at 444, 448 or 452), the user may choose at 460 to modify or vary the treatments of the positions in the current sample. This process may be initiated by selecting at 462 a position to manipulate, and the application locates and retrieves the pre-stored data for the selected position at 464. The user may then at 466 select from among a displayed set of options a treatment (e.g., a yarn end or pom of a particular color) to replace that of the currently selected position. This selection is executed by the application at 468. At 470, the user may select from among a set of variations for the selected style a particular yarn end or pom, the selection executed by the application at 472. Then, in order to visualize the current sample having the newly selected yarn end or pom in the selected position, the user can choose at 478 to substitute the new pom or yarn end for the original one in the designated position of the model, executed at 480.

Figure 10:
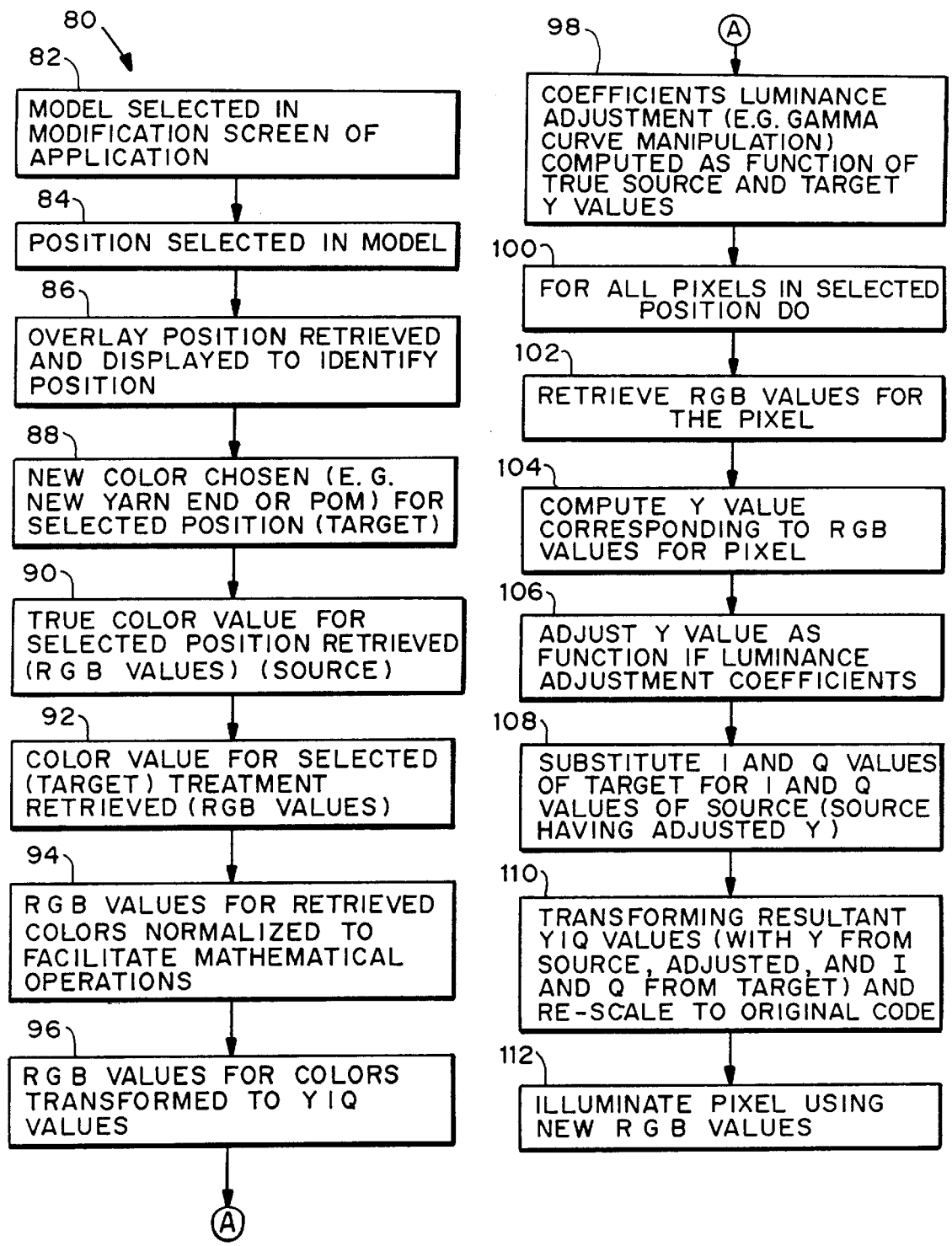
FIG. 10 is a flowchart showing steps in a method of adjusting colors in a digitized image according to and embodying the present invention.
Figure 11:
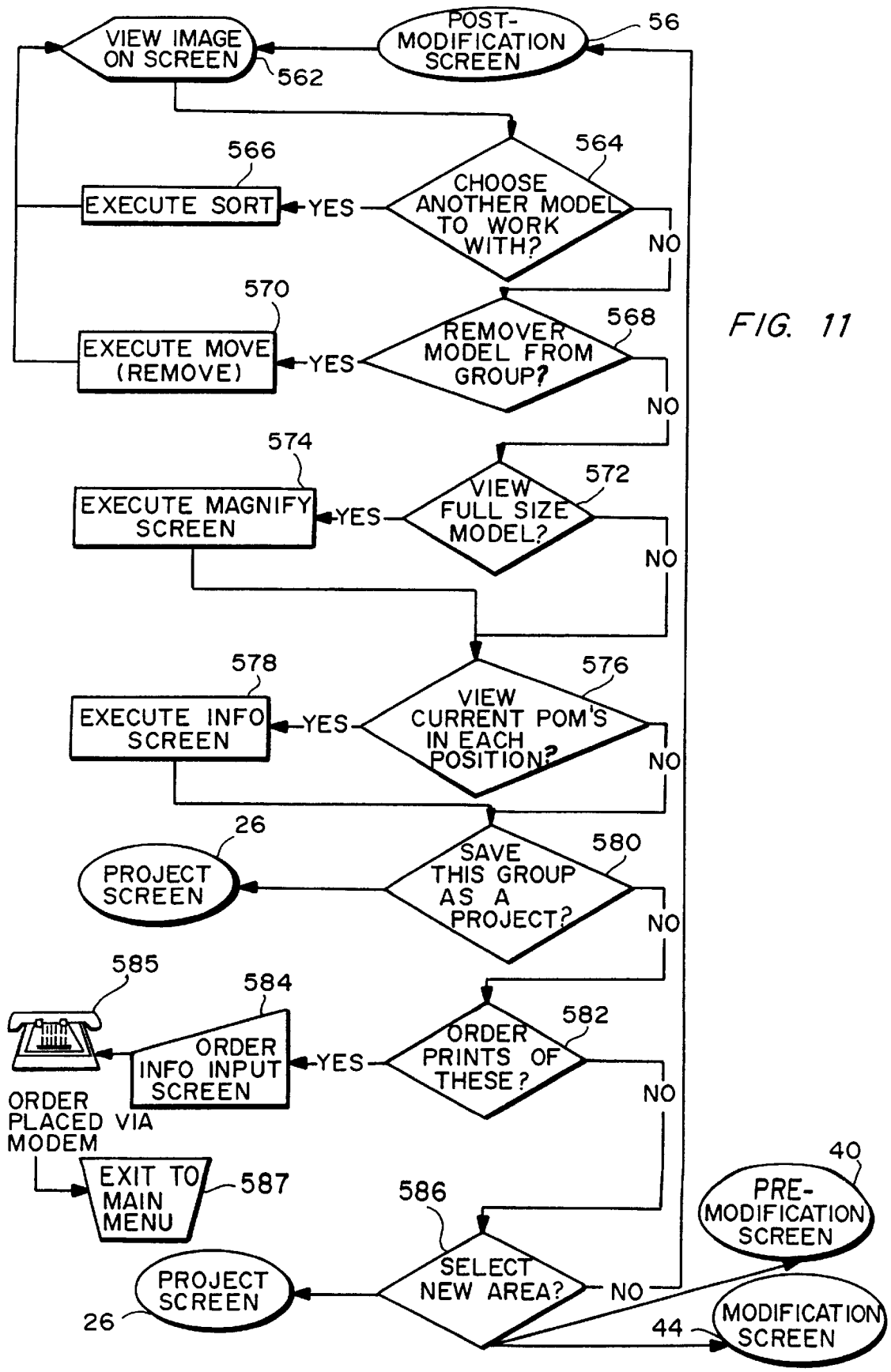
FIG. 11 is a seventh portion of a flowchart showing the post-modification portion of the embodiment shown in the block diagram of FIG. 3.

The substitution of the selected (target) yarn end or pom for the original (source) yarn end or pom in the selected position, according to the present invention, involves a process, an embodiment of which is set forth at reference numeral 80 in FIG. 10. The invention is not limited to the particular steps or ordering shown in FIG. 10; rather, these can be varied or combined (for performance or other reasons, for example) in a manner consistent with the disclosed functionality without departing from the scope or spirit of the present invention. First, the file for the model corresponding to the sample will have been retrieved into memory at step 82 in order to display the image of the model on the screen. A position has been selected in the model at step 84 (corresponding to step 462 in FIG. 9). The application then retrieves the black and white or luminance image overlay (generated at step 76 of the process set forth in FIG. 2 and described in the accompanying text) corresponding to the selected position. This overlay image is displayed as an overlay on the sample image, highlighting the selected position for the user, in which position the newly chosen yarn end or pom, step 88 (corresponding to step 478 of FIG. 9), is to be added.

According to the present invention, the characteristics of two different color models for raster graphics are employed to facilitate the transformation of color in a particular position. Raster graphic techniques based on television technology are conventional in most computer and video settings. In a raster graphics system, graphical primitives (such as characters, lines, and other features) are stored in a buffer in terms of their component "pixels." A "pixel" is a shortened form for "picture element" (also known as a "pel") and refers to the elements of a display from which the screen image is constructed. A raster is a set of horizontal raster lines, each line constituting a set of individual pixels. One raster line at a time, an image is scanned to the display by a video controller, painting the screen. According to convention, this process begins at the top and continues until the bottom line of the image is scanned.

The content of a raster image is controlled by modulating the manner in which the scanning beam or beams illuminate each individual pixel. In black and white or luminance images, only one beam is used, and the desired screen luminance at a particular pixel is a direct function of the intensity of the beam when it points at that pixel. In color systems, three beams are used, one red, one green and the third blue, and the desired color at a particular pixel is determined by the intensities of these three color components.

Several conventions or models assist in manipulating colors in a video or computer screen image. A color model generally represents a range or gamut of colors using a three dimensional (3D) coordinate system. Using this approach, virtually any color can be specified with high precision by referring to its position in the 3D space using the coordinates for each dimension. The colors can then be manipulated using mathematical techniques, such as the tools of linear algebra. For example, since any two 3D color models all represent the same phenomenon—colored light—the specification of a color in one system can be transformed into any other model by linearly transforming a 3D vector from a source model to a 3D vector in a target model by conventional matrix multiplication.

The possibility of a 3D model is implied by the fact that most colors of light can generally be created by combining three component light beams. This is probably easiest to understand for one model that happens to be of particular importance for the present invention. That model, known as the RGB (for red, green and blue), is used with color CRT (cathode ray tube) monitors in most computer graphics applications. The RGB model places black at the origin (0, 0, 0) of a Cartesian coordinate system, and white at the (1, 1, 1) vertex on the unit cube, a point in RGB space farthest from the origin. Gray tones lie along a line connecting these two points. Blue is located at (0, 0, 1); red at (1, 0, 0) and green at (0, 1, 0); cyan is located at (0, 1, 1), magenta at (1, 0, 1), and yellow at (1, 1, 0).

Another model of interest for the present invention is the YIQ color model. This model is employed in the broadcast of color television signals in the United States. YIQ is essentially a re-coding or linear transformation of RGB for transmission efficiency. YIQ-encoded signals may easily be converted into a black and white signal, so that the signals can be viewed on black and white televisions. This easy conversion is possible because the first of the YIQ dimensions, Y, refers not to yellow but to luminance. In black and white television systems, only the Y component of a YIQ signal is displayed. The chromaticity of the signal is captured in the I and the Q components.

Conveniently, a YIQ vector for a pixel can be computed from an RGB vector using the following relationship:

$$\begin{bmatrix} Y \\ I \\ Q \end{bmatrix} = \begin{bmatrix} 0.2989 & 0.5866 & 0.1144 \\ 0.5959 & -0.2741 & -0.3218 \\ 0.2113 & -0.5227 & 0.3113 \end{bmatrix} \begin{bmatrix} R \\ G \\ B \end{bmatrix}$$

A YIQ vector for a pixel can be transformed back into an RGB pixel vector by the following operation, in which the matrix is simply the inverse of the above transform matrix.

$$\begin{bmatrix} R \\ G \\ B \end{bmatrix} = \begin{bmatrix} 1.0002 & 0.9563 & 0.6210 \\ 1.0000 & -0.2717 & -0.6484 \\ 1.0003 & -1.1053 & 1.7022 \end{bmatrix} \begin{bmatrix} Y \\ I \\ Q \end{bmatrix}$$

In order to substitute one yarn end or pom in a particular position for the yarn end or pom currently in that position, the RGB vector for the "true" color of the pom or yarn end currently residing in the selected position (i.e., the "source" image) is retrieved, at 90. Also, the RGB values for the treatment of the position (here, the true target color of the desired yarn end or pom) are retrieved at 92. The values of the true source color and target RGB color vectors are then preferably scaled or normalized at 94 from a machine code (e.g., defined in the interval ($0 \leq S \leq 255$)) to a normalized value in the interval ($0 \leq S \leq 1$) in order to permit algebraic operations to be performed on the values, or for any other reasons that may be necessary or desirable depending upon the particularities of the application. The RGB vectors for the true source color and for the target color are then transformed at step 96, using the first of the above-identified matrices, into a YIQ representation.

Also it may be necessary to ensure that the ultimate RGB representation includes legitimate values (in the defined range for that model). In one embodiment of the present invention, Y and Q may thus be adjusted to fall respectively within the ranges: ($-0.596 \leq Y \leq 0.596$) and ($-0.525 \leq Q \leq 0.525$). Moreover, an adjustment may be performed to take into account the psychophysical phenomenon that the human eye perceives different hues as having different brightness (despite the possibility that they may have identical physical brightness). To accomplish these adjustments, the well-known technique of gamma curve manipulation (or gamma correction) is performed. According to known methods, the mapping from a source luminance to a desired target luminance can be represented by a polynomial function, namely a quadratic:

$$Y = ax^2 + bx + c$$

whose coefficients are a function of the true source and target luminance values. Specifically, if the desired target luminance is $Y_T$ and the desired source luminance is $Y_S$, then the coefficient b, for the first order term of the quadratic, is given by:

$b=(Y_T-Y_S^2)/[Y_S(1-Y_S)]$
and a, the coefficient for the second order term of the quadratic is given by:

$a=1-b$

These coefficients are computed at step 98.

Then, referring to step 100, the following steps are performed for all pixels in the selected position (which had been pre-stored as a black and white overlay). The RGB values for the pixel are retrieved at step 102. Then the Y value corresponding to the retrieved RGB values for the pixel is computed at step 104 using the first of the above-defined matrix operations. The Y value may then be adjusted at step 106 according to the above-defined gamma correction function (or other suitable function). Next, replacement YIQ values for the present pixel are selected: Y is set to the adjusted Y value and the I and Q values are set to those of the target color. Thus, the present pixel will be characterized by the chrominance of the target and a luminance adjusted as a function of the source and target luminances. Finally, at step 110, the resultant YIQ values are transformed back to the RGB space. They may then be re-scaled, also at 110, to lie in the original interval (e.g., (0≦S ≦255)) and memory locations corresponding to the pixel may be written with these values to illuminate the pixel, at step 112, with the luminance-adjusted target color. The foregoing steps are repeated for all pixels in the selected position.

Returning to FIG. 9, the user can view the updated image at 482. If at 478 the user decided not to proceed to add the pom or yarn end to the selected position, he or she can select at 462 the same or a different position to work with. The application partially fills in the selected pom or yarn end and then stops to prompt the user at 484 whether, based on the partial view, she or he wishes to continue with the pom or yarn end change. If the user so selects, the application at 486 completes filling in the position with the selected pom or yarn end according to the method described above. The result may be viewed at 488. Alternatively, the user could at 484 have elected not to continue with the change, but rather return to step 462 and re-initiate the modification process. At 490, the application checks whether all positions have been changed. In a preferred embodiment, it is preferable in terms of developing a complete specification for the sample to require that all the positions be examined and changed (even if the "change" is not a genuine change, but rather retains the same pom or yarn end); this ensures that the file containing the specifications for the sample contains complete data as to the content of all the positions. If at 490 it was not the case that all the positions had been changed, control would return to step 462, at which the user could select a new position to work with. On the other hand, if all positions have been changed, the user may then choose at 492 to add the resulting sample to a working list that can be manipulated in the post-modification screen 56, executed at step 494. Whether or not the resulting sample is added to the working list, the user can then select whether to move to a new area of the application. A move can be made to return to the pre-modification screen 40, to initiate a database index and search in screen 30 or to move ahead to the post-modification screen 56.

In the post-modification screen 56, the user can leaf through the previously designed samples and organize the results of the foregoing session into a project file. At step 564 a sample may be chosen to work with, which is retrieved at 566 for display on the screen at 562. The user may repeat the foregoing steps as necessary until a desired sample is arrived at. The user may then, if she or he wishes, remove the particular viewed sample from the working set, the removal being executed at 570.

At 576, the user may again choose to view the treatments, such as the yarn ends or poms, in each position, which is executed by the application at step 578. The user may then at step 580 choose to add the sample to the current working list and associate it with a project name so that it can later be pulled up in the project screen 26. The sample design being viewed is then added to the current project list at step 588 (see FIG. 5). When the user has developed sufficient interest in a particular sample design, she or he may decide at step 582 to place an order for one or more prints. The application then displays an order information input screen at 584, which permits the user to enter information regarding the transaction, such as: customer name, project name, pertinent information regarding the current project for that customer, name of the sales representative, a description of the customer's business, the customer's address, telephone and facsimile number, square yardage, where the carpet is planned to be installed, type of setting, type of carpet backing, etc. Following step 584, the application creates a file containing the order information, including the specification for the particular sample to be imaged, as well as information regarding the customer. The order can be transmitted at 585 by any means, such as (without limitation) electronically by modem, to a central facility at which a high resolution photograph image can be generated using techniques analogous to those described in connection with FIG. 10, and utilizing PHOTOSHOP® or other suitable photograph manipulation tool. The user can then decide at step 586 whether to continue choosing models to work with, or to select a new area of the application, such as returning to the pre-modification screen 40, or to the modification screen 44, or to the project screen 26. (In the project screen 26, at step 588 (FIG. 5), the current project can be added to the project list.) If the user has finished placing orders of prints and/or defining a project to continue to work on or refer to at a later time, she or he may exit, at 58. Of course, the application can be exited at any point via main menu 24 but a single point of exit has been indicated that the location where it would be most logical following session.

The methods according to the present invention, such as the embodiment described above, can be implemented using any conventional computer system having sufficient memory, processing power and graphics capability, including but not limited to electronic notebooks, or desktop personal computers equipped with a POWER PC® or PENTIUM® processor, and having a keyboard, color screen and a cursor positioning means. In addition, the methods according to the present invention have utility as articles of manufacture stored on any computer readable medium, such as floppy disk, hard disk, (optically readable) compact disk, tape, or in a read only or random access memory, without limitation.

What is claimed is:

1. A method for adjusting at least one color in a color photographic image from a source color to a target color, the RGB and YIQ model values for the source and target colors being known and stored in a data storage device, a pre-selected representative RGB color value for the source color also being stored in a data storage device, the color photographic image, including the subset of the image having the source color, having been digitized to produce a full color digital image represented with the RGB color model and the digital image is stored in a data storage device, the method comprising the steps of:

a. retrieving the RGB values for the true source color from the data storage device;

b. computing the Y component of the YIQ representation of the RGB value for the true source color;

c. retrieving the RGB values for the target color from the data storage device;
d. computing the YIQ values for the target color from the retrieved RGB values;
e. computing luminance adjustment coefficients as a function of the Y value of the true source color and the Y value of the target color; and
f. for all pixels of the image having the source color:
   i) retrieving the RGB values for the pixel;
   ii) computing the Y value corresponding to the retrieved RGB values for the pixel;
   iii) adjusting the Y value corresponding to the retrieved RGB value for the pixel as a function of the coefficients computed in step d in order to correct for psychophysical phenomena;
   iv) substituting the I and Q values for the target color for the I and Q values for the pixel, so that the pixel is characterized by the chrominance of the target color and the adjusted luminance; and
   v) transforming the resultant YIQ values for the pixel to the RGB color model for display.

2. The method of claim 1, wherein the adjustment of the Y value in step f.iii., is performed according to the function:

$$Y = ax^2 + bx + c$$

where $b = (Y_T - Y_S^2)/[Y_S(1-Y_S)]$
where $a = 1 - b$
and where the Y value for the true source color is $Y_S$ and the Y value for the target color is $Y_T$.

3. A method for adjusting at least one color in a color photographic image from a source color to a target color, the RGB and YIQ model values for the source and target colors being known and stored in a data storage device, a preselected representative RGB color value for the source color also being stored in a data storage device, the color photographic image, including the subset of the image having the source color, having been digitized to produce a fill color digital image represented with the RGB color model and the digital image is stored in a data storage device, the method comprising the steps of:
a. transforming the RGB values for the source color and the target color to the YIQ color model;
b. converting the RGB values for the target color to the YIQ color model;
c. substituting the I and Q values of the target color for the I and Q values of the source color, so that the resultant YIQ values include the luminance of the source color and the chrominance of the target color;
d. transforming the resultant YIQ values including the luminance of the source color and the chrominance of the target color to the RGB color model; and
e. displaying the RGB color model for the target color.

* * * * *